US008374049B2

(12) United States Patent
Liu et al.

(10) Patent No.: US 8,374,049 B2
(45) Date of Patent: Feb. 12, 2013

(54) DIMM MEMORY MODULE REFERENCE VOLTAGE SWITCHING CIRCUIT

(75) Inventors: Yingnan Liu, San Diego, CA (US); Ying Cai, Sichuan (CN)

(73) Assignee: AgigA Tech Inc., San Diego, CA (US)

(*) Notice: Subject to any disclaimer, the term of this patent is extended or adjusted under 35 U.S.C. 154(b) by 359 days.

(21) Appl. No.: 12/756,439

(22) Filed: Apr. 8, 2010

(65) Prior Publication Data

US 2011/0249515 A1 Oct. 13, 2011

(51) Int. Cl.
*G11C 5/14* (2006.01)

(52) U.S. Cl. .................................. 365/228; 365/189.09

(58) Field of Classification Search ............. 365/189.09, 365/226, 228, 229

See application file for complete search history.

(56) References Cited

U.S. PATENT DOCUMENTS

| | | | | |
|---|---|---|---|---|
| 6,324,103 | B2 * | 11/2001 | Hiraki et al. | 365/189.05 |
| 6,735,142 | B1 * | 5/2004 | Oh | 365/227 |
| 2007/0195613 | A1 * | 8/2007 | Rajan et al. | 365/189.05 |
| 2010/0008174 | A1 * | 1/2010 | Sartore et al. | 365/228 |
| 2010/0008175 | A1 * | 1/2010 | Sweere et al. | 365/229 |
| 2011/0141827 | A1 * | 6/2011 | Mozak et al. | 365/189.09 |
| 2011/0227552 | A1 * | 9/2011 | Hu et al. | 323/304 |

* cited by examiner

*Primary Examiner* — Douglas King
(74) *Attorney, Agent, or Firm* — FSP LLC

(57) ABSTRACT

A non-volatile memory module includes a volatile memory circuit and a reference voltage generator coupled to supply a reference voltage to the volatile memory circuit. The reference voltage provides a level by which the volatile memory and external devices may communicate reliably at high speeds. The reference voltage is applied to an external interface of the non-volatile memory module through an isolation circuit. A control circuit coupled to the isolation interface and to a circuit which is adapted to detect when the non-volatile memory module no longer draws power from an external source.

2 Claims, 8 Drawing Sheets

DIMM MEMORY MODULE REFERENCE VOLTAGE SWITCHING CIRCUIT

BACKGROUND

Certain types of high speed memory circuits may require a reference voltage which provides a level by which the volatile memory and external devices may communicate reliably at high speeds. Maintaining a proper reference voltage to such memory circuits is important for correct operation. In conventional systems, a single reference voltage source is used throughout the operation of the system employing the memory circuits, and consistency of the reference voltage is maintained through use of a single source. However, such systems are inflexible. There is a need for reference voltage sources that may adapt to changing system operating conditions, such as loss of system power.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Preliminaries

Figure 1:
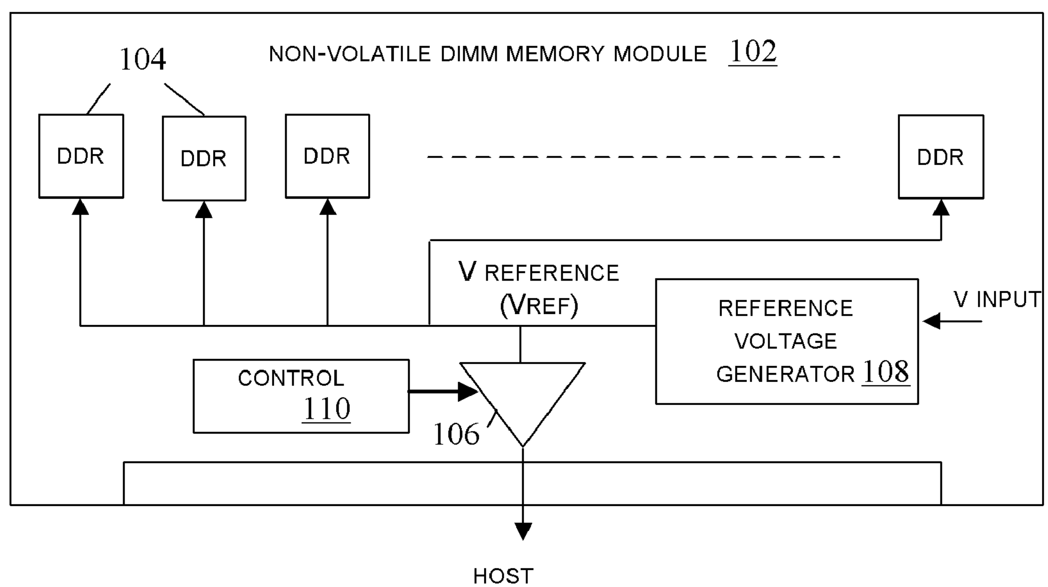
FIGS. 1 and 2 are block diagrams of embodiments of a memory module.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to control signals and/or settings embodied in machine-readable media (e.g. magnetic or optical disks) and/or circuitry (e.g. memory or other electronic or optical circuits) that may be applied to influence the operation of a device. Software storage media, circuits, electrical magnetic and optical memory, and firmware, are examples of physical structure that may embody logic. In general, logic may comprise combinations of software media, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

Overview

In one embodiment, a memory module includes memory circuits (typically but not exclusively volatile and nonvolatile memory circuits) and a reference voltage generator coupled to supply a reference voltage to the memory circuit. The reference voltage provides a voltage level by which the volatile memory and external devices may communicate reliably at high speeds. The reference voltage is applied through an isolation circuit to an external interface of the memory module. A control circuit is coupled to the isolation circuit and to a circuit which is adapted to detect when the memory module no longer draws power from an external source. The memory module may further comprise one or more capacitors to supply power to the memory circuit and voltage reference generator.

In another embodiment, a memory module includes a memory circuit and an interface to a reference voltage source external to the module, providing an external reference voltage to the memory circuit by which the volatile memory and external devices may communicate reliably at high speeds. The memory module may include an internal reference voltage generator and a control circuit that decouples the memory circuit from the external reference voltage, and couples it to a reference voltage from the internal reference voltage generator, upon the memory module ceasing to draw power from an external power source.

Reference Voltage Source

Certain types of machine memory circuits may require application of a stable reference voltage for proper operation. High-speed DDR memory circuits are one example of this type of memory circuit.

In one application, a memory module receives power to operate from an external hosting system into which the module is installed. During powered operation of the host system, the host is the primary power source for the memory module. The memory module receives power from a second (e.g. backup) power source under certain conditions. One such condition is when the host power is unavailable. The secondary source for power may be included in the memory module or external to it, but preferably is included in the module. The memory module comprises a reference voltage generator. A voltage generated by the voltage reference generator of the memory module is applied to memory circuits of the memory module. In a first embodiment, the reference voltage is also output from the internal reference voltage generator to an external interface of the memory module, and from there to the host system memory controller. The host memory controller applies the reference voltage when reading and/or writing signals from the memory circuits of the module.

FIG. 1 is a block diagram illustration of an embodiment of a memory module 102. The memory module comprises DDR (Double Data Rate) memory 104. Although illustrated with DDR type memory, the techniques and structures described herein are applicable to other types of memory as well, not just DDR.

The module 102 comprises a reference voltage generator 108 which is coupled to provide a reference voltage to the DDR memory 104. The reference voltage may facilitate the fast and reliable operation of the DDR memory 104 during interoperation with external devices. The reference voltage from the reference voltage generator 108 is further applied via an isolation circuit 106 to an external interface of the module 102, and from the external interface to an external system (host), such as a more extensive device incorporating the memory module 102.

The external system may apply the reference voltage to read and write signals on a memory bus coupled to the DDR memory 104. In other words, the reference voltage from the internal generator 108 may be applied by the host system to facilitate interpretation of the signals on the memory bus. A control circuit 110 may operate the isolation circuit 106 when the memory module 102 ceases to draw power from the external system. For example upon loss of external system power, the memory module 102 may switch to the use of a secondary power source, for example an internal power source comprising one or more capacitors (e.g. ultra capacitors capable of sufficient charge storage to power the module 102 for a period of time). The isolation circuit 106 is operated upon a primary power interruption event to disconnect the reference voltage from reaching the external interface of the memory module 102, and hence disconnect the reference voltage source 108 from the external system in circumstances in which the external system becomes unstable, unpredictable, or an excessive load on the reference voltage source 108.

Under certain conditions, for example when host power is unexpectedly interrupted, turned off or otherwise made unavailable, the voltage reference generator 108 continues to supply the reference voltage to the memory circuits 104. However, the reference voltage is disconnected from the output terminal(s) of the memory module 102. Isolating the voltage reference from the external interface of the memory module 102 is coordinated with powering the memory module 102 from a secondary power source without drawing power from the host system. In another words, disconnecting the reference voltage from the external interface of the memory module 102 is coordinated with the memory module 102 ceasing to draw power from the host system.

In another embodiment, a reference voltage is received by the memory module 102 from the external system through the memory module's external interface and applied to the memory circuits 104 during powered operation of the host system into which the memory module 102 is installed. In coordination with the memory module 102 no longer drawing power from an external system, the reference voltage applied to the memory circuits 104 is switched away from the reference voltage supplied via the external interface and over to a reference voltage provided by the internal reference voltage generator 108 of the memory module 102. In this embodiment, a reference voltage that the host system uses to read and write data on a host memory bus from or to the memory circuits 104 is also provided to the memory circuits 104 of the memory module 102 via the memory module external interface. However, the memory circuits 104 are switched to a different reference voltage generated by circuits of the memory module 102 itself in coordination with the module 102 ceasing to draw power from a primary source.

Figure 2:
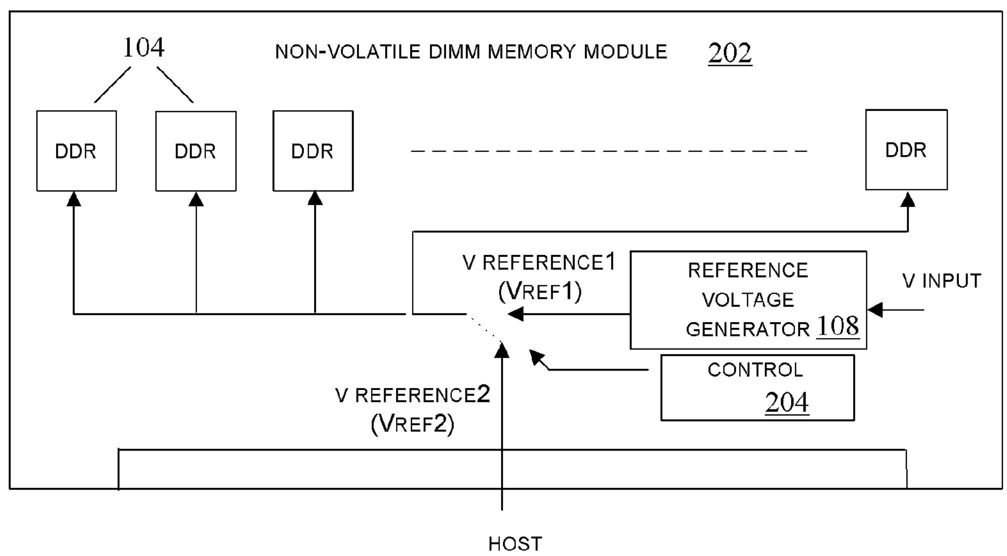

FIG. 2 is a block diagram illustration of another embodiment of a memory module 202. In this embodiment, a voltage is supplied by an external system (host) during situations when memory module 202 draws power from the external system. This external reference voltage is applied to the memory circuits 104 of the memory module 202. A control circuit 204 switches the reference voltage that is applied to the memory circuits 104 from the reference voltage provided by the external system to a reference voltage provided by internal reference voltage generator 108, upon conditions in which the memory module 202 ceases to draw power from the external system.

Hybrid Memory Subsystem

Figure 3:
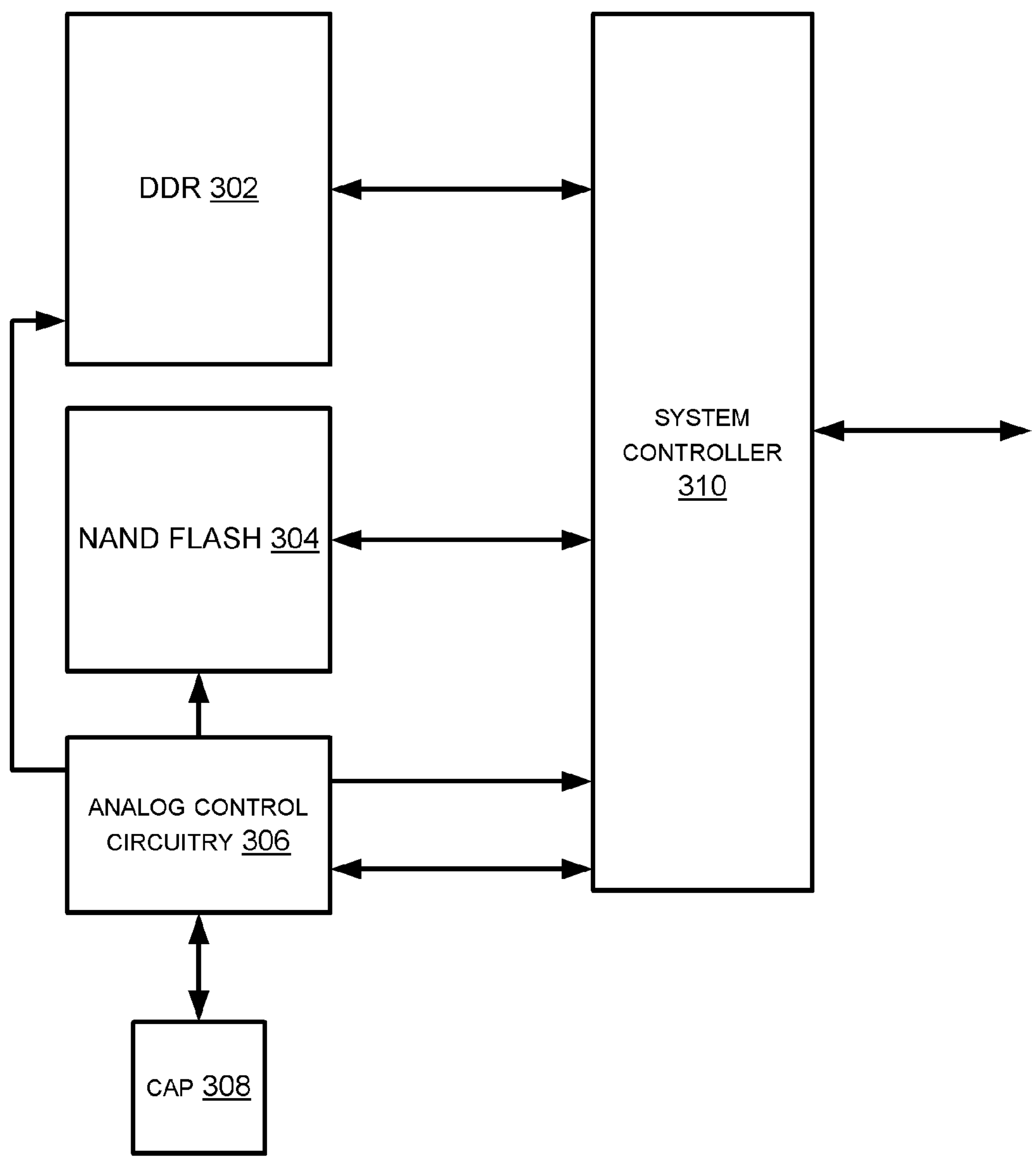
FIG. 3 is a block diagram of an embodiment of a hybrid memory subsystem.
Figure 4:
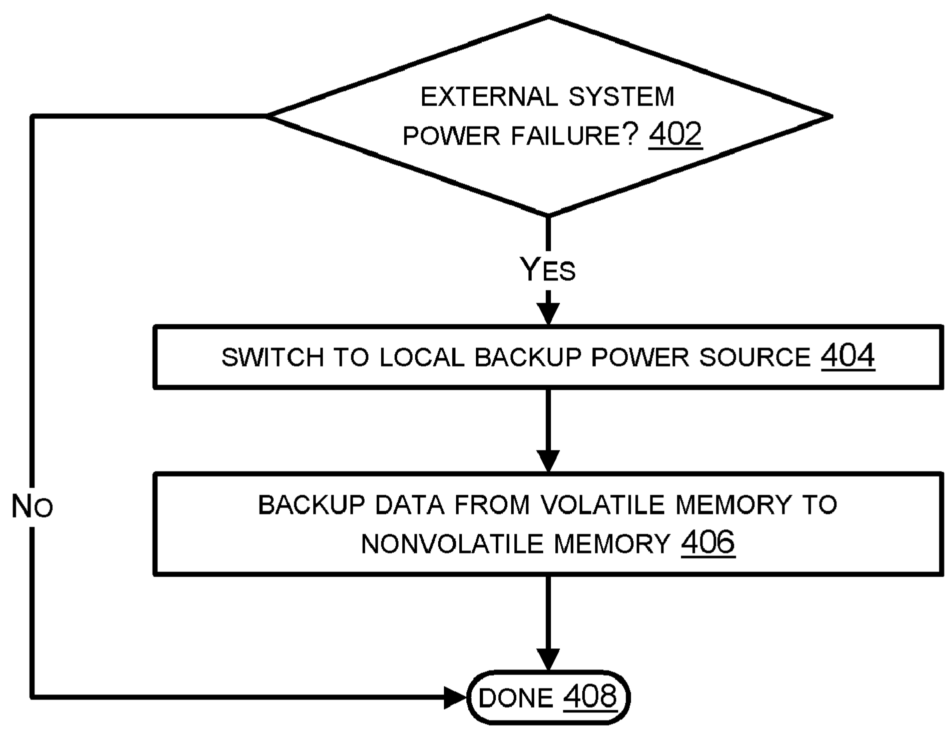
FIG. 4 is a flow chart of an embodiment of a data backup process.
Figure 5:
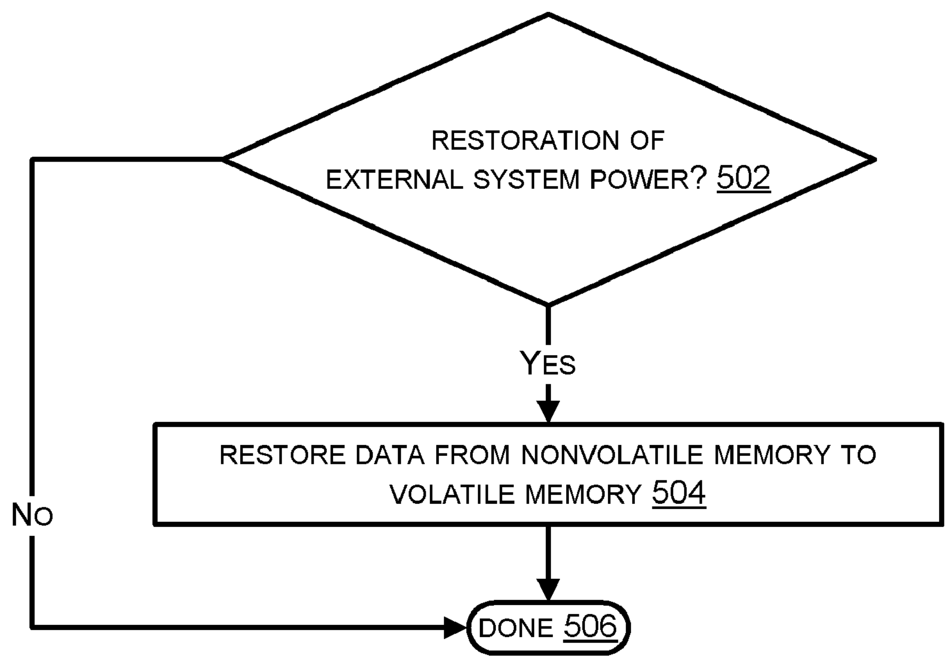
FIG. 5 is a flow chart of an embodiment of a data restoration process.

FIGS. 3-5 describe the structure and operation of an embodiment of a hybrid memory subsystem that may incorporate features of the exemplary memory modules 102, 202 described, supra.

FIG. 3 is a block diagram of an embodiment of a hybrid memory subsystem. The subsystem provides a low-cost, high density, non-volatile memory by using a low-cost volatile memory 302 in conjunction with a low-cost non-volatile memory 304.

The memory subsystem includes, but may not be limited to, volatile memory 302 (e.g. DDR), non-volatile memory 304 (e.g. FLASH), power control circuitry 306, power capacitor 308, and a system controller 130. Other elements and/or couplings among the elements may be apparent to skilled practitioners in the relevant art(s).

The volatile memory in this embodiment is a SDRAM 302 (Synchronous Dynamic Random Access Memory). Other types of volatile random access memory may also be used. The nonvolatile memory in this embodiment is a NAND FLASH 304, and again, other types of nonvolatile memory may be used.

The power control circuitry 306 interfaces the memory subsystem to an external power source, typically the power source of a larger system that incorporates and uses the hybrid memory subsystem. For example, the external power source may be the power of personal or business computer system that incorporates the memory subsystem.

The power control circuitry 306 also interfaces the memory subsystem to a backup power source that is local to the memory subsystem. The backup power source may be, for example, a capacitor 308 or small battery (or a combination of the two). In the embodiment of FIG. 1, a capacitor 308 provides power to the memory subsystem for a temporary time when external power is interrupted. The capacitor 308 may provide power for long enough to copy data blocks from volatile memory 302 to nonvolatile memory 304.

In the event of an external power failure, the hybrid memory subsystem may operate as an isolated subsystem of the larger, external system. The power circuitry 306 may recognize that external system power has failed. The system controller 130 may then initiate backup of data currently stored in the volatile memory 302 into the non-volatile memory 304. Herein, the term "backup" means that data of the volatile memory 302 is stored into the nonvolatile memory 304. Upon restoration of external system power, the system controller 110 may initiate restoration of backed-up data from non-volatile memory 304 to volatile memory 302. Herein, the term "restore" and "restoration" means that data of the nonvolatile memory 304 is stored into the volatile memory 302.

The system controller 310 may thus include logic to backup data from volatile memory 302 to nonvolatile memory 304 when the external power source fails, and to restore data from nonvolatile memory 304 to volatile memory 302 when the external power source becomes available.

Those skilled in the art will appreciate that various functional components, such as the power controller logic 306 and the system controller logic 130, and even the volatile memory 302 and nonvolatile memory 304, may in fact be implemented together as one or more integrated circuit devices, and packaged as one or more discrete physical components.

Data stored within the hybrid memory subsystem persists even when the power of the external system fails. The external system may interact with the hybrid memory subsystem as though interacting with volatile memory 302 (of the same or another type), even though, transparently, the data is stored internally by the memory subsystem in nonvolatile memory 304 persistently in the absence of external system power.

The hybrid memory system may write data to non-volatile memory 304 only in the event that external system power becomes unavailable or unreliable. Thus, the non-volatile memory 304 undergoes many fewer write cycles than would occur if it were being written every time data were written to the hybrid memory subsystem. When the non-volatile memory 304 is a low-cost, limited duty cycle NAND FLASH, the result in an extension of the useful lifetime of the non-volatile memory 304.

The system controller 310 provides a memory interface to the external system. The memory interface may comprise a standard data and control interface for some particular kind of volatile memory. For example, the system controller may provide an SDRAM data, address, and control interface to the external system. The interface provided to the external system may or may not be the interface for the type of volatile memory 302 actually used by the memory subsystem.

The system controller 310 may additionally provide an interface whereby the external system may send commands to the hybrid memory subsystem or obtain status. For example, in some embodiments the external system may command the hybrid memory subsystem to initiate a backup of data from volatile memory 302 to non-volatile memory 304, even though the system power is still available. Additionally or alternatively, the hybrid memory subsystem or external system may provide a direct user interface, such as a switch or control on a graphic user interface, whereby a user of the external system may directly initiate a copy of data from volatile 302 to non-volatile memory 304. Another action which may in some embodiments be initiated either through the system interface of the system controller 110, or directly by a user, is restoring data from non-volatile memory 304 to volatile memory 302. In some embodiments the external system may use its system interface to the hybrid memory controller 110 to initiate a self test of the hybrid memory subsystem.

Other examples and/or embodiments of the various system components may now be apparent to skilled practitioners in the relevant art(s).

Hybrid Memory Subsystem Operation

As previously described, the system controller 110 may comprise logic to interface the volatile memory 302 to an external system, such as a personal computer system or a business computer system. Other examples of applications of the hybrid memory subsystem are embedded control applications, communications, and consumer products.

The system controller 310 may present an interface to the external system, so that the volatile memory 302 is addressable for reading and writing of data by the external system.

Logic of the power controller 306 may detect when power from the external system to at least one of the volatile and nonvolatile memories and to the controller fails. For example, the external system may suffer a power source outage or battery failure. When external system power fails, the power controller 306 may provide backup power to the volatile memory 302, nonvolatile memory 304, and to the controller 310 for long enough to enable the backup of data from the volatile memory 302 to the nonvolatile memory 304. The capacitor or battery power source 308 may act as the source of this backup power.

In some embodiments, the controller 310 may include logic to enable the external system to initiate a backup of data from the volatile memory 302 to the nonvolatile memory 104, instead of waiting for a power failure to initiate the backup. The controller 310 may also comprise logic to emulate to the external system a type of volatile memory other than a type of the volatile memory. For example, internally the memory subsystem may employ DDR for the volatile memory 302. However, the controller may include logic to emulate single data rate RAM (SDRAM), double data rate RAM (DDRAM), DDR2, asynchronous SRAM, C-F card, or PCI-Express (among other examples) to the external system.

The volatile memory 302, nonvolatile memory 304, controller 310, and power controller 106 may implemented in various ways. For example, these components may be implemented as one of a multi-chip set, a board subsystem, or even a single chip.

The embodiment shown in FIG. 3 shows that backups and restores of data are implemented as data moves from the volatile memory 302 to the nonvolatile memory 304, and vice versa, via the controller 310. In other embodiments, backups and restores may be implemented via data moves from the volatile memory 302 to the nonvolatile memory 304 directly, without passing through the controller 310.

FIG. 4 is a flow chart of an embodiment of a data backup process. If external system power fails (see 402), backup power from a local source, such as a capacitor, is applied to operate the memory subsystem (see 404). Data is backed up from volatile memory to nonvolatile memory, see 406. At 408 the process concludes.

The backup power source has been discussed in terms of one or more capacitors local to the hybrid memory subsystem. However, the backup power source, such as one or more capacitors, may also be provided by the external system.

The backup power source may be applied upon failure of external system power (i.e. the primary power source), which may involve some form of switching function from primary to backup power. Power switching functions inherently involve some latency (switching time), which may provide a vulnerability to losing all power to the memory subsystem if the switching function fails, or becomes too slow. Thus, in some embodiments power is always supplied to the hybrid memory subsystem via the backup power source. The hybrid memory subsystem may for example always draw power from one or more backup power capacitors, which in turn are continually recharged from external system power when such power is available. Upon external system power failure, the memory subsystem continues to draw power from the backup power capacitors, drawing down their voltage, while for example performing a power-down save of data in volatile memory 302 to nonvolatile memory 304.

Thus, the term “system power” or “primary power” may refer to power from the external system as applied to the memory subsystem via one or more backup power sources, such as power capacitors. The term “backup power” may refer to power applied to the memory subsystem via power sources internal to the memory module once power from the external system is unavailable.

The memory subsystem is thus isolated from the external system that uses it in at least two ways. First, memory access isolation is provided by interposing the controller interface 310 (which may or may not be the same as the volatile memory 302 interface) between the memory subsystem and the external system. Second, power isolation from the main system may be provided by "gating" external system power through the backup power source.

Upon restoration of external system power, logic of the controller 310 may operate to restore data from the nonvolatile memory 304 to the volatile memory 302.

FIG. 5 is a flow chart of an embodiment of a data restoration process. At 502, if there is restoration of external system power, the control circuitry recognizes the power restoration. At 504, data is restored from nonvolatile memory to volatile memory. At 506 the process concludes.

Operational Examples

Figure 6:
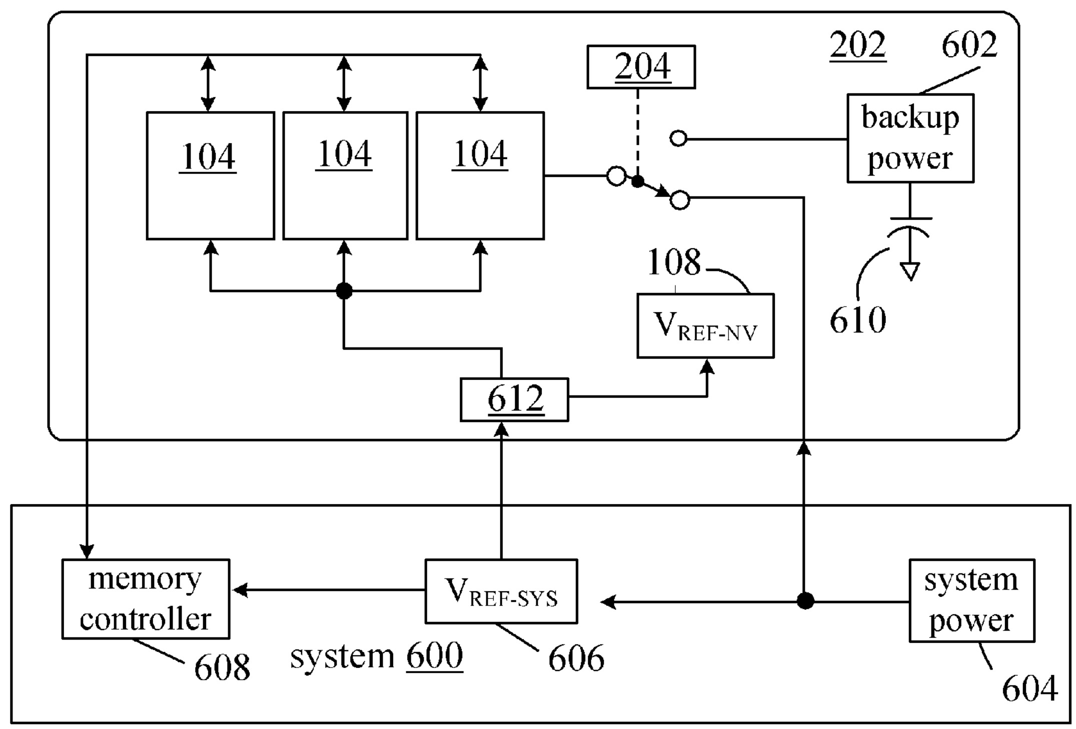
FIGS. 6-7 illustrate stages of a process of switching a reference voltage source upon detection that a memory module no longer draws power from an external source.

FIG. 6 illustrates an external system 600 utilizing memory logic 104 of a memory module 202. The external system 600 comprises a memory controller 608, and a system (host) power supply 604 that provides power both to circuits of the external system 600 and to the memory circuits 104. The memory module 202 comprises an internal power source 602 that may utilize one or more capacitors 610 to store charge for providing power to the memory circuits 104 in circumstances where system power 604 is unavailable. In one mode of operation, the memory logic 104 utilizes a reference voltage from a reference voltage source 606 of the external system 600. The reference voltage is provided to the memory logic 104 via an external interface of the memory module 202.

In one embodiment, the memory module 202 comprises sample and hold logic 612 that helps maintain consistency between the internal voltage reference source 108 and the external logic reference source 606. Control logic 110 may operate the sample and hold logic 612 to discontinue sampling the reference voltage from the external source 606 upon the memory module 202 ceasing to draw power from the external power source 604, or when the external reference source 606 is detected as becoming unreliable.

Figure 7:
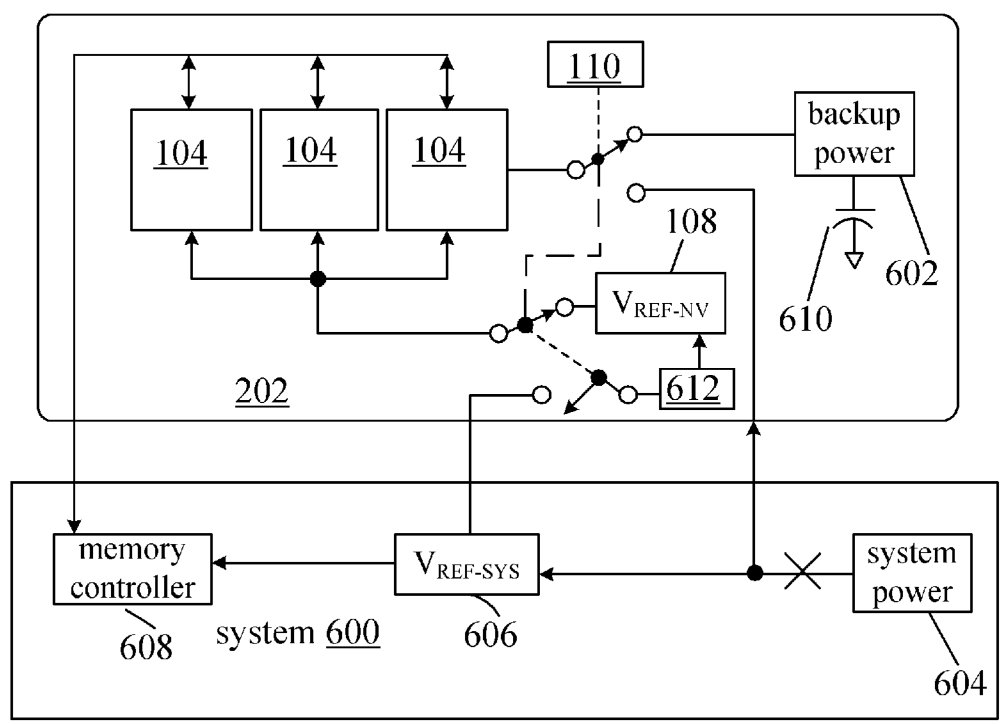

FIG. 7 illustrates the switch to power supply 602 and reference voltage source 108. The switch may be accomplished via independence switching logic (the switches for the power 602 and reference voltage 108 may be operated independently of one another). For example, the switch to power 602 may occur slightly before the switch to reference supply 108.

Figure 8:
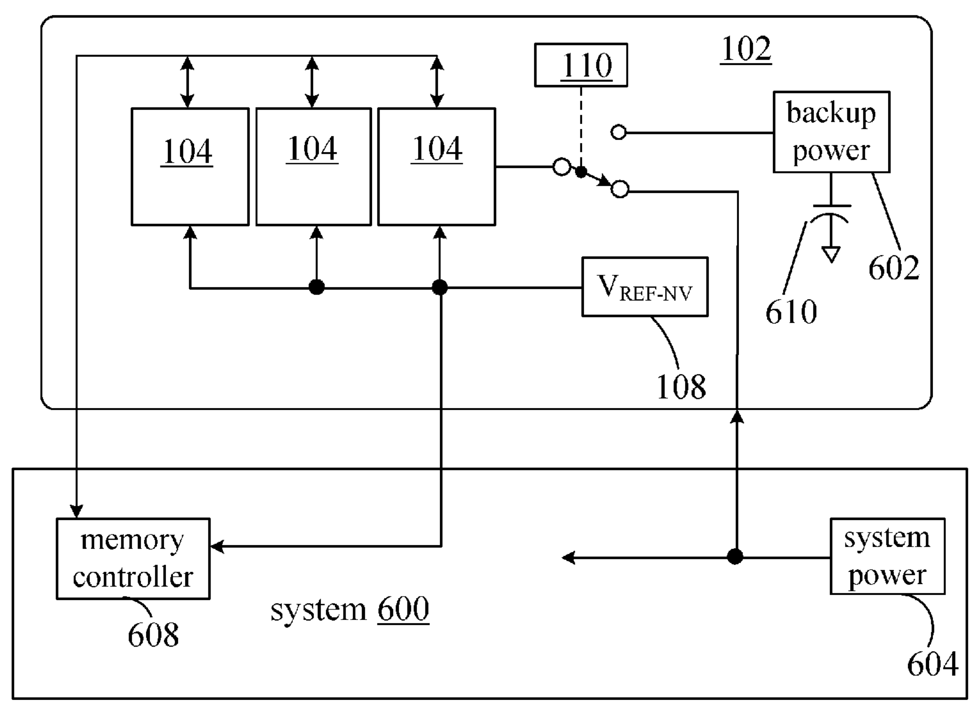
FIGS. 8 and 9 illustrate stages of a process of decoupling a memory circuit from an external reference voltage and to a reference voltage from internal reference voltage generator upon the memory module seeing to draw power from an external source.
Figure 9:
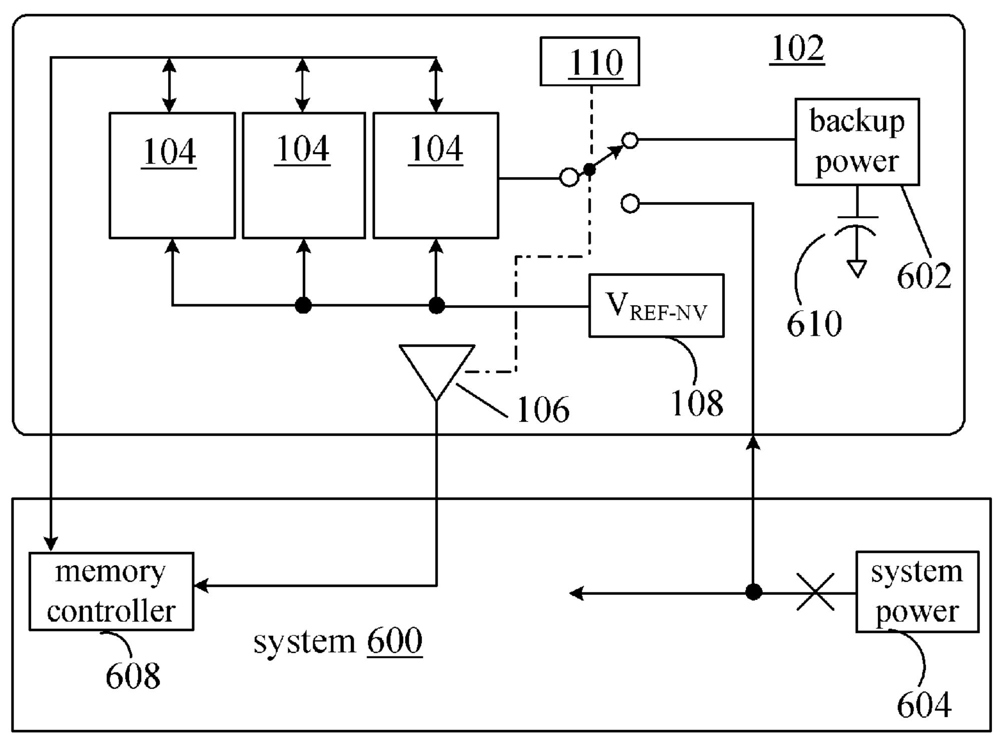

FIGS. 8 and 9 illustrate an exemplary process of a memory module 102 responding to the event of no longer drawing power from an external system 600. Memory logic 104 draws power from an external source 604 via an external interface of the memory module 102. The memory logic 104 receives a reference voltage from a reference voltage source 108 internal to the module 102. The reference voltage from 108 is also provided to a memory controller 608 of the external system 600 via an external interface of the memory module 102. In FIG. 9, the memory module 102 ceases to draw power from the system power source 604; in response, control logic 110 of the memory module 102 switches the source of power for the memory logic 104 to the module power source 602. The control logic 110 further operates an isolation circuit 106 to isolate the reference voltage source 108 from an external interface of the module 102.

Implementations and Alternatives

Those having skill in the art will appreciate that there are various logic implementations by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A. non-volatile memory module comprising:

a volatile memory circuit;

a reference voltage generator coupled to supply a reference voltage to the volatile memory circuit;

the reference voltage provides a level by which the volatile memory circuit and external devices may communicate reliably at high speeds;

an isolation circuit through which the reference voltage is applied to an external interface of the non-volatile memory module; and a control circuit coupled to the isolation interface and to a circuit which is adapted to detect when the non-volatile memory module no longer draws power from an external source and to operate the isolation circuit to isolate the reference voltage generator from the external interface when the non-volatile memory module no longer draws power from the external source.

2. A method comprising:

a memory module drawing power from an external source;

the volatile memory module providing a reference voltage from an internal source to both internal memory circuits and to an external system comprising the external source of power;

the memory module ceasing to draw power from the external source;

the act of ceasing to draw power from the external source causing the memory module to isolate the reference voltage from the external system while continuing to provide the reference voltage to the internal memory circuits.

* * * * *